(12) United States Patent
Lin

(10) Patent No.: US 9,106,073 B2
(45) Date of Patent: Aug. 11, 2015

(54) ELECTRONIC APPARATUS

(71) Applicant: Chih-Chiang Lin, Taichung (TW)

(72) Inventor: Chih-Chiang Lin, Taichung (TW)

(73) Assignees: Wintek (China) Technology Ltd., Guangdong Province (CN); WINTEK CORPORATION, Taichung (TW)

( * ) Notice: Subject to any disclaimer, the term of this patent is extended or adjusted under 35 U.S.C. 154(b) by 302 days.

(21) Appl. No.: 13/855,731

(22) Filed: Apr. 3, 2013

(65) Prior Publication Data

US 2013/0265678 A1      Oct. 10, 2013

(30) Foreign Application Priority Data

Apr. 10, 2012   (TW) ............................. 101112640 A

(51) Int. Cl.
| | |
|---|---|
| *H02H 9/00* | (2006.01) |
| *H02H 7/20* | (2006.01) |
| *H02H 9/06* | (2006.01) |
| *H05K 9/00* | (2006.01) |
| *H05K 1/02* | (2006.01) |
| *H01T 4/10* | (2006.01) |

(52) U.S. Cl.
CPC .. *H02H 9/06* (2013.01); *H01T 4/10* (2013.01); *H05K 1/026* (2013.01); *H05K 9/0067* (2013.01); *H05K 2201/09354* (2013.01)

(58) Field of Classification Search
CPC ...................................................... H01L 23/60
USPC ............. 361/56, 91.1, 111, 112, 120; 257/173
See application file for complete search history.

(56) References Cited

U.S. PATENT DOCUMENTS

| | | | | | |
|---|---|---|---|---|---|
| 3,676,742 | A | * | 7/1972 | Russell et al. ................... | 361/56 |
| 5,823,826 | A | * | 10/1998 | Ward et al. ............... | 439/620.07 |
| 2003/0089979 | A1 | * | 5/2003 | Malinowski et al. ......... | 257/724 |
| 2006/0250744 | A1 | * | 11/2006 | McTigue et al. ............... | 361/120 |
| 2007/0057327 | A1 | * | 3/2007 | Chen .............................. | 257/355 |
| 2010/0039838 | A1 | * | 2/2010 | Carpenter ........................ | 363/52 |
| 2011/0089540 | A1 | * | 4/2011 | Drost et al. .................... | 257/660 |
| 2013/0090010 | A1 | * | 4/2013 | Darrow et al. ............ | 439/620.03 |
| 2014/0070380 | A1 | * | 3/2014 | Chiu et al. ..................... | 257/666 |

* cited by examiner

*Primary Examiner* — Thienvu Tran
*Assistant Examiner* — Christopher Clark
(74) *Attorney, Agent, or Firm* — Jianq Chyun IP Office

(57) ABSTRACT

An electronic apparatus includes an electronic device, a circuit board, a ground layer and a drive chip. The circuit board includes a substrate, a patterned circuit layer disposed on the substrate and a protective layer exposing a portion of the patterned circuit layer to define at least one ground pin and plural of input/output (I/O) pins. Each of the I/O pins has a first incisive terminal, and a length of the ground pin is greater than a length of each I/O pins. The ground layer covers a portion of the protective layer and a portion of the ground pin. The ground layer has plural of second incisive terminals corresponding to the first incisive terminals. A gap exists between the orthographic projections of each first incisive terminal and the corresponding second incisive terminal on the substrate. The drive chip is electrically connected to the electronic device via the circuit board.

9 Claims, 4 Drawing Sheets

# ELECTRONIC APPARATUS

CROSS-REFERENCE TO RELATED APPLICATION

This application claims the priority benefit of Taiwan application serial no. 101112640, filed on Apr. 10, 2012. The entirety of the above-mentioned patent application is hereby incorporated by reference herein and made a part of this specification.

BACKGROUND

1. Field of the Invention

The invention relates to an electronic apparatus, and more particularly, to an electronic apparatus that prevents electro-static discharge (ESD) and electro-magnetic interference (EMI).

2. Description of Related Art

In the current electronic products, they are often assembled with at least one printed circuit board (PCB) or flexible printed circuitry (FPC). Generally speaking, circuit boards often carry at least one electronic component, such as an integrated circuit (IC) or a passive component. When an electro-static discharge (ESD) occurs, the electronic component is influenced by a large current suddenly generated due to the electro-static discharge, and a system belonging thereto crashes or is even damaged permanently.

The above ESD phenomenon may be categorized into a human body model (HBM), a machine model (MM), a charged device model (CDM), etc. In the conventional technical field of ESD protection, a countermeasure device is often disposed on a path on which the ESD may occur according to different models to disperse energy generated during the ESD. The countermeasure device is often expensive, thereby causing manufacturing costs of the electronic products to increase greatly. In addition, a circuit design with a point discharge disposed on the ESD path is used to disperse the energy generated during the ESD. However, the circuit design of the point discharge is disposed on various paths on which the ESD may occur, which causes an area of the circuit board to increase and causes a burden on the manufacturing costs.

SUMMARY OF THE INVENTION

The invention provides an electronic apparatus that prevents electro-static discharge (ESD) and electro-magnetic interference (EMI) and has better product reliability.

The invention provides an electronic apparatus including an electronic device, a circuit board, a ground layer and a drive chip. The circuit board is disposed at a side of the electronic device and electrically connected to the electronic device. The circuit board includes a substrate, a patterned circuit layer and a protective layer. The patterned circuit layer is disposed on the substrate. The protective layer is disposed on the patterned circuit layer and exposes a portion of the patterned circuit layer to define at least one ground pin and a plurality of input/output (I/O) pins. Each of the I/O pins has a first incisive terminal, and a length of the ground pin is greater than a length of each of the I/O pins. The ground layer is disposed on the circuit board and covers a portion of the protective layer and a portion of the ground pin. The ground layer has a plurality of second incisive terminals corresponding to the first incisive terminals of the I/O pins, and there is gap between an orthographic projection of each first incisive terminal on the substrate and an orthographic projection of the corresponding second incisive terminal on the substrate. The drive chip is disposed on the circuit board and electrically connected to the electronic device via the circuit board.

In an embodiment of the invention, the electronic device includes a liquid crystal display module (LCM) or a touch panel.

In an embodiment of the invention, the length of the ground pin is equal to or greater than twice of the length of each of the I/O pins.

In an embodiment of the invention, a material of the ground layer includes a silver paste.

In an embodiment of the invention, a width of the ground layer is at least 5/6 times of the length of each of the I/O pins.

In an embodiment of the invention, the gap is less than 0.5 millimeters.

In an embodiment of the invention, the electronic apparatus further includes a main board having at least one ground terminal electrically connected to the ground pin. When an ESD current generated on the main board flows to the circuit board via at least one of the I/O pins, the gap between the corresponding first and second incisive terminals prevent the ESD current from being delivered to the drive chip, and the ground layer delivers the ESD current to the ground terminal of the main board via the ground pin.

In an embodiment of the invention, the ground layer includes a first ground block and a second ground block. The first ground block covers a portion of the protective layer and a portion of the ground pin, and the second ground block is connected to the first ground block and extends towards the drive chip to cover at least a portion of the protective layer on the patterned circuit layer.

In an embodiment of the invention, a width of the first ground block is less than a width of the second ground block.

Based on the above, the invention uses a gap between the first incisive terminals of the I/O pins and the second incisive terminals of the ground layer to prevent the ESD current from being delivered to the drive chip and transmits the ESD current out of the circuit board by the ground layer covering the ground pin. In this way, an interference generated by an ESD phenomenon is prevented effectively to protect the drive chip. Furthermore, in addition to covering the ground pin, the ground layer also covers the patterned circuit layer under the protective layer and prevents effectively an EMI generated by signals of the patterned circuit layer; therefore, EMI radiations are effectively shielded and effects of ESD immunity are improved to increase a product reliability of the electronic apparatus.

In order to make the aforementioned features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
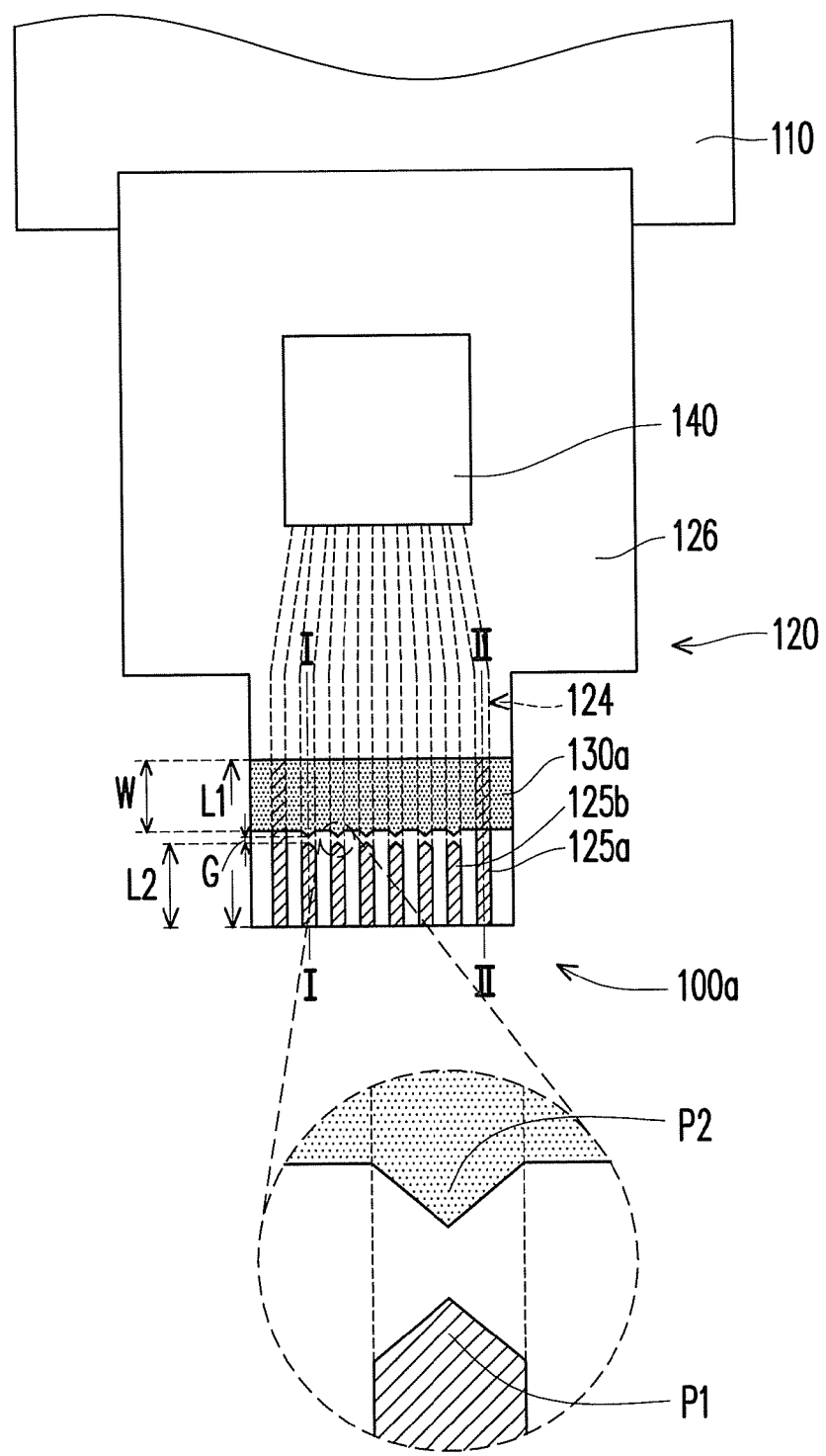
FIG. 1A is a schematic top view of an electronic apparatus according to an embodiment of the invention.
Figure 1B:
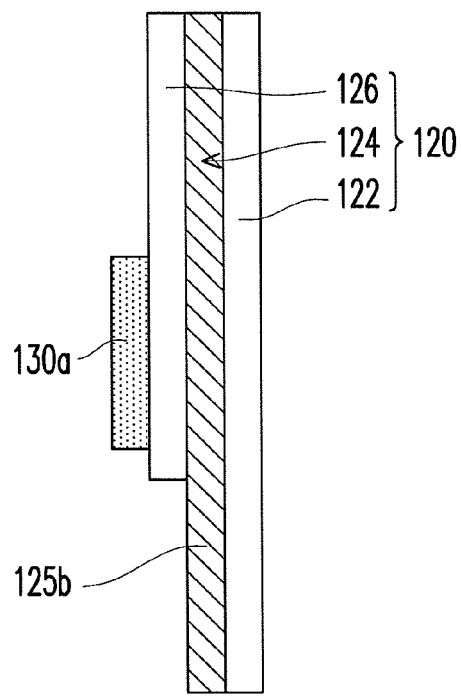
FIG. 1B is a schematic cross-sectional view taken along line I-I as depicted in FIG. 1A.
Figure 1C:
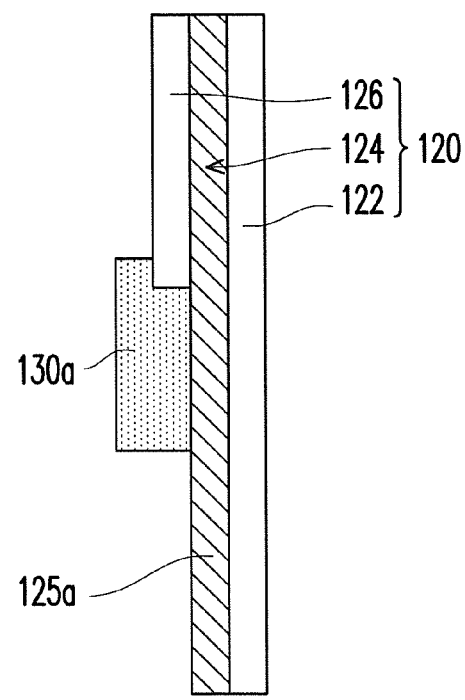
FIG. 1C is a schematic cross-sectional view taken along line II-II as depicted in FIG. 1A.

FIG. 1A is a schematic top view of an electronic apparatus according to an embodiment of the invention. FIG. 1B is a schematic cross-sectional view taken along line I-I as depicted in FIG. 1A. FIG. 1C is a schematic cross-sectional view taken along line II-II as depicted in FIG. 1A. Referring to FIG. 1A, in the present embodiment, an electronic apparatus 100a includes an electronic device 110, a circuit board 120, a ground layer 130a and a drive chip 140. Herein, the electronic device 110 is, for example, a liquid crystal display module (LCM) or a touch panel, which is not limited herein. In addition, the circuit board 120 is, for example, a flexible printed circuit (FPC) board or a printed circuit board (PCB), which is not limited herein.

In detail, referring to FIGS. 1A, 1B, and 1C, the circuit board 120 is disposed at a side of the electronic device 110 and electrically connected to the electronic device 110. The circuit board 120 includes a substrate 122, a patterned circuit layer 124 and a protective layer 126. The patterned circuit layer 124 is disposed on the substrate 122. The protective layer 126 is disposed on the patterned circuit layer 124 and exposes a portion of the patterned circuit layer 124 to define at least one ground pin 125a (only two are schematically illustrated in FIG. 1A) and a plurality of input/output (I/O) pins 125b insulated from one another. The ground pin 125a and the I/O pins 125b are insulated from one another and are spaced, for example, at equidistant intervals. Each of the I/O pins 125b has a first incisive terminal P1, and a length L1 of the ground pin 125a is greater than a length L2 of each of the I/O pins 125b. Preferably, the length L1 of the ground pin 125a is equal to or greater than twice of the length L2 of each of the I/O pins 125b.

Referring to FIGS. 1A and 1C, the ground layer 130a is disposed on the circuit board 120 and covers a portion of the protective layer 126 and a portion of the ground pin 125a, wherein the ground layer 130a covers at least the ground pin 125a and a portion of the protective layer 126. In particular, the ground layer 130a has a plurality of second incisive terminals P2 corresponding to the first incisive terminals P1 of the I/O pins 125b, and there is a gap G between an orthographic projection of each first incisive terminal P1 on the substrate 122 and an orthographic projection of the corresponding second incisive terminal P2 on the substrate 122. Preferably, the gap G is at least 0.5 millimeters. Herein, a material of the ground layer 130a is, for example, a silver paste, and a width W of the ground layer 130a is at least 5/6 times of the length L2 of each of the I/O pins 125b. As shown in FIG. 1A, the length L2 of each of the I/O pins 125b is substantially a distance from the first incisive terminals P1 to an end of the circuit board 120. In addition, the drive chip 140 is disposed on the circuit board 120 and electrically connected to the electronic device 110 via the circuit board 120.

Since in the present embodiment, the second incisive terminals P2 of the ground layer 130a and the first incisive terminals P1 of the I/O pins 125b belong to different layers, i.e., not the same layer, a circuit layout area required on the circuit board 120 is greatly reduced. Furthermore, in the present embodiment, with an effect of point discharge, the first incisive terminals P1 of the I/O pins 125b and the second incisive terminals P2 of the ground layer 130a guide an ESD current (not shown) to the ground layer 130a, thereby preventing the ESD current from being delivered to the drive chip 140, and even transmit the ESD current out of the circuit board 120 by the ground layer 130a covering the ground pin 125a. In this way, interference generated by an ESD phenomenon is prevented effectively to protect the drive chip 140. In summary, the electronic apparatus 100a of the present embodiment prevents the ESD effectively and has better product reliability.

It should be noted that the reference numerals and a part of the contents in the previous embodiment are used in the following embodiments, in which identical reference numerals indicate identical or similar components, and repeated descriptions of the same technical contents are omitted. For a detailed description of the omitted parts, reference can be found in the previous embodiment, and no repeated description is contained in the following embodiments.

Figure 2:
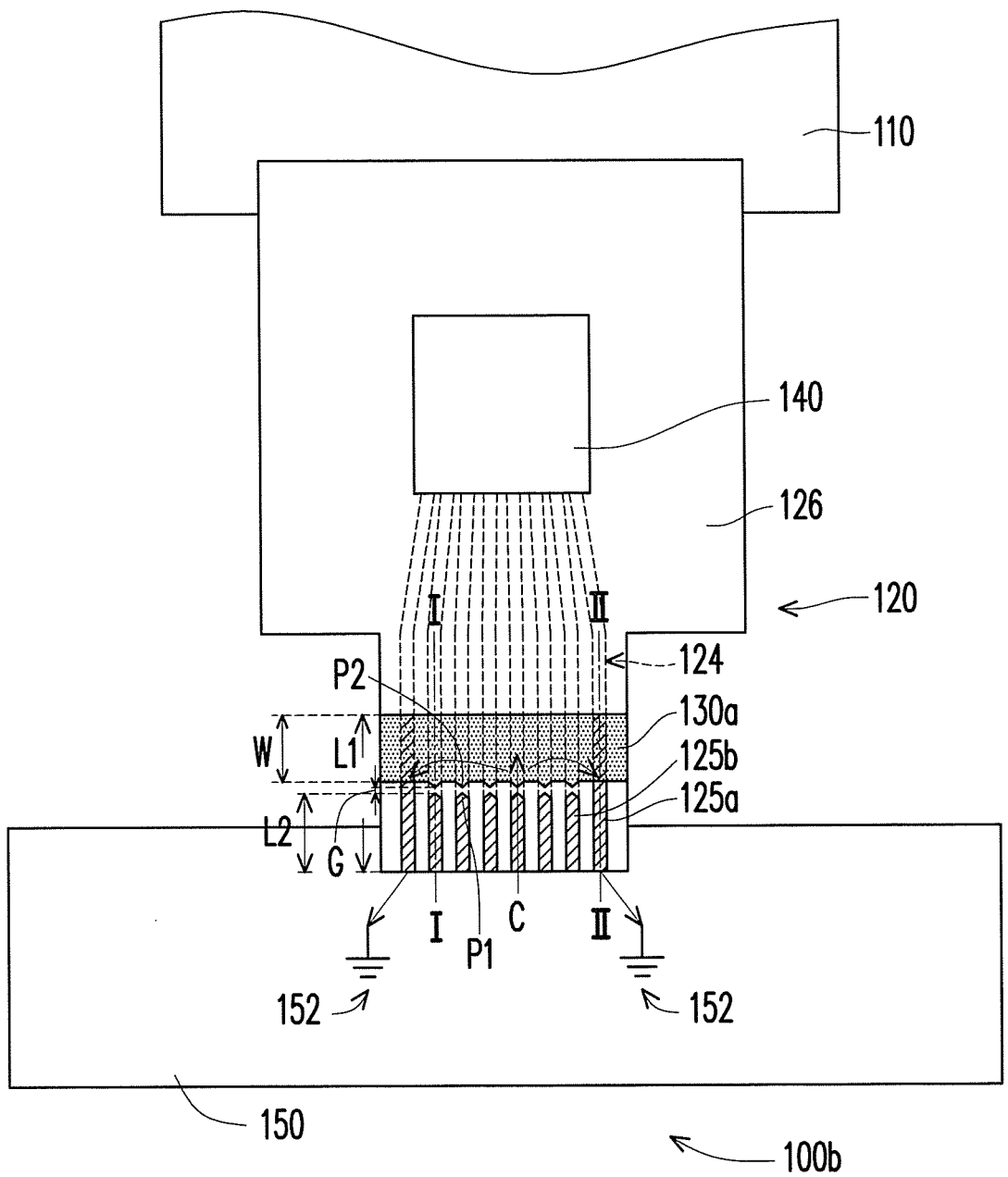
FIG. 2 is a schematic top view of an electronic apparatus according to another embodiment of the invention.

FIG. 2 is a schematic top view of an electronic apparatus according to another embodiment of the invention. Referring to FIG. 2, an electronic apparatus 100b of the present embodiment is similar to the electronic apparatus 100a of FIG. 1. A main difference between the two electronic apparatuses 100b and 100a is that the electronic apparatus 100b of the present embodiment further includes a main board 150 having at least one ground terminal 152 (only two are schematically illustrated in FIG. 2). Herein, the circuit board 120 is electrically connected to the main board 150, and the ground pin 125a is electrically connected to the ground terminal 152.

In particular, when a ESD current C (referring to an arrow direction) generated on the main board 150 transmits to the circuit board 120 through at least one of input/output (I/O) pins 125b, the first incisive terminals P1 of the I/O pins 125b guide the ESD current C to the second incisive terminals P2 of the ground layer 130a, so that the ground layer 130a delivers the ESD current C to the ground terminal 152 of the main board 150 through the ground pin 125a, thereby effectively preventing the ESD current C from being delivered to the drive chip 140. In this way, interference generated by an ESD phenomenon is prevented effectively to protect the drive chip 140.

Figure 3:
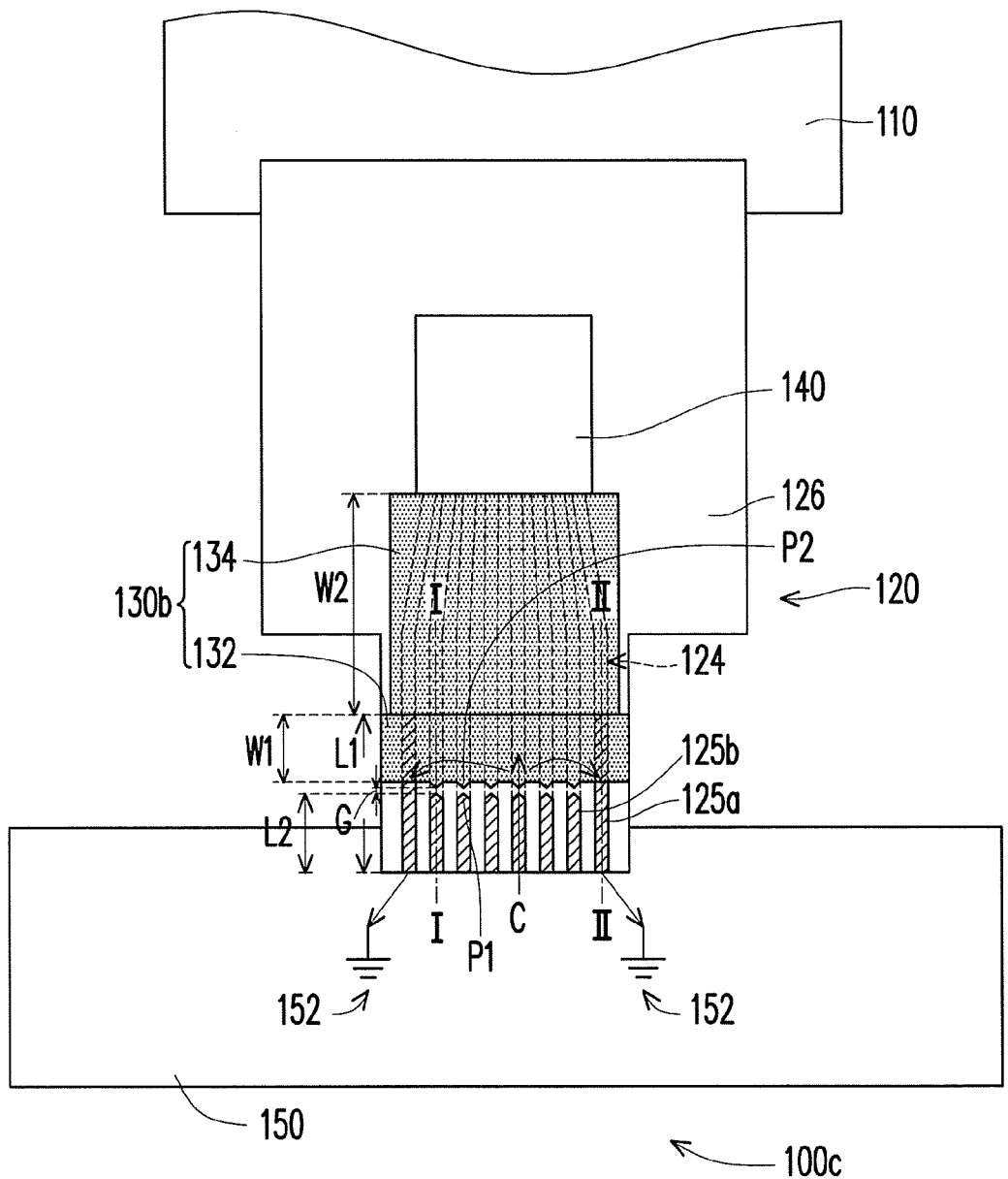
FIG. 3 is a schematic top view of an electronic apparatus according to still another embodiment of the invention.

FIG. 3 is a schematic top view of an electronic apparatus according to still another embodiment of the invention. Referring to FIG. 3, an electronic apparatus 100c of the present embodiment is similar to the electronic apparatus 100b of FIG. 2. A main difference between the two electronic apparatuses 100c and 100b is that a ground layer 130b of the electronic apparatus 100c of the present embodiment further includes a first ground block 132 and a second ground block 134 to increase effects of ESD immunity and EMI protection. In detail, the first ground block 132 covers a portion of the protective layer 126 and a portion of a ground pin 125a, and a width W1 of the first ground block 132 is substantially 5/6 times of a length L2 of each input/output (I/O) pin 125b. As shown in FIG. 3, the length L2 of each of the I/O pins 125b is substantially a distance from first incisive terminals P1 to an end of a circuit board 120. The second ground block 134 is connected to the first ground block 132 and extends towards a drive chip 140 to cover at least a portion of a protective layer 126 on a patterned circuit layer 124. Herein, the second ground block 134 extends to a side edge of the drive chip 140, and the width W1 of the first ground block 132 is, for example, less than a width W2 of the second ground block 134. Since compared with the ground layer 130a of FIG. 2, the ground layer 130b of the present embodiment covers more protective layer 126, and the first ground block 132 and the second ground block 134 cover the portion of the protective layer 126 on the patterned circuit layer 124, an EMI generated by signals of the patterned circuit layer 124 are prevented effectively; therefore, EMI radiations are effectively shielded and effects of ESD immunity are improved.

Based on the above, the invention utilizes a gap between the first incisive terminals of the I/O pins and the second incisive terminals of the ground layer to prevent the ESD current from being delivered to the drive chip and transmits the ESD current out of the circuit board by the ground layer covering the ground pin. In this way, an interference generated by an ESD phenomenon is prevented effectively to protect the drive chip. Furthermore, in addition to covering the ground pin, the ground layer also covers the patterned circuit layer under the protective layer and prevents effectively an EMI generated by signals of the patterned circuit layer; therefore, the EMI radiations are effectively shielded and effects of the ESD immunity are improved to increase the product reliability of the electronic apparatus. In addition, since in the invention, the second incisive terminals of the ground layer and the first incisive terminals of the I/O pins belong to different layers, a circuit layout area required on the circuit board is greatly reduced.

Although the invention has been disclosed by the above embodiments, they are not intended to limit the invention. It will be apparent to persons of ordinary skill in the art that modifications and variations to the invention may be made without departing from the spirit and the scope of the invention. Therefore, the protection scope of the invention falls in the appended claims.

What is claimed is:

1. An electronic apparatus, comprising:
   an electronic device;
   a circuit board disposed at a side of the electronic device and electrically connected to the electronic device, the circuit board comprising:
   a substrate;
   a patterned circuit layer disposed on the substrate; and
   a protective layer disposed on the patterned circuit layer and revealing a portion of the patterned circuit layer including at least one ground pin and a plurality of input/output (I/O) pins, wherein each of the I/O pins has a first incisive terminal, and a length of the ground pin is greater than a length of each of the I/O pins;
   a ground layer disposed on the circuit board and covering a portion of the protective layer and a portion of the ground pin, wherein the ground layer has a plurality of second incisive terminals corresponding to the first incisive terminals of the I/O pins, and there is a gap between each first incisive terminal and an orthographic projection of the corresponding second incisive terminal on the substrate; and
   a drive chip disposed on the circuit board and electrically connected to the electronic device via the circuit board.

2. The electronic apparatus as recited in claim 1, wherein the electronic device comprises a liquid crystal display module or a touch panel.

3. The electronic apparatus of claim 1, wherein the length of the ground pin is equal to or greater than twice of the length of each of the I/O pins.

4. The electronic apparatus as recited in claim 1, wherein a material of the ground layer comprises a silver paste.

5. The electronic apparatus as recited in claim 1, wherein a width of the ground layer is at least 5/6 times of the length of each of the I/O pins.

6. The electronic apparatus as recited in claim 1, wherein the gap is less than 0.5 millimeters.

7. The electronic apparatus as recited in claim 1, further comprising a main board having at least one ground terminal electrically connected to the ground pin, wherein when an electro-static discharge current generated on the main board flows to the circuit board via at least one of the I/O pins, the gap between the corresponding first and second incisive terminals prevent the electro-static discharge current from being delivered to the drive chip, and the ground layer delivers the electro-static discharge current to the ground terminal of the main board via the ground pin.

8. The electronic apparatus as recited in claim 1, wherein the ground layer comprises a first ground block and a second ground block, the first ground block covers a portion of the protective layer and a portion of the ground pin, and the second ground block is connected to the first ground block and extends towards the drive chip to cover at least a portion of the protective layer on the patterned circuit layer.

9. The electronic apparatus as recited in claim 8, wherein a width of the first ground block is less than a width of the second ground block.

* * * * *